United States Patent [19]

Parrillo et al.

[11] Patent Number: 5,442,235
[45] Date of Patent: Aug. 15, 1995

[54] SEMICONDUCTOR DEVICE HAVING AN IMPROVED METAL INTERCONNECT STRUCTURE

[75] Inventors: Louis C. Parrillo; Jeffrey L. Klein, both of Austin, Tex.

[73] Assignee: Motorola Inc., Schaumburg, Ill.

[21] Appl. No.: 172,320

[22] Filed: Dec. 23, 1993

[51] Int. Cl.$^6$ .......................................... H01L 29/460
[52] U.S. Cl. ..................... 257/758; 257/762; 257/767
[58] Field of Search ............... 257/758, 765, 771, 762, 257/774

[56] References Cited

U.S. PATENT DOCUMENTS

| | | | |
|---|---|---|---|
| 3,743,894 | 7/1973 | Hall et al. | 257/771 |
| 4,335,506 | 6/1982 | Chiu et al. | 257/771 |
| 4,812,419 | 3/1989 | Lee et al. | 437/203 |
| 5,202,579 | 4/1993 | Fujii et al. | 257/758 |

FOREIGN PATENT DOCUMENTS 202551  11/1983  Japan .

OTHER PUBLICATIONS

IBM TDB "Metallization for Shallow Junction Silicon Technology" d'Heurle et al. vol. 19 No. 8 Jan. 1977.
Tao, et al., Electromigration Characteristics of Al/W Via Contact Undo-Unidirectional and Bidirectional Current Conditions Proc. 1991 VLSI Multilevel Interconnect Conf., pp. 390–392.
Hu, et al., Electromigration in Al/W and Al(Cu)/W Interconnect Structures 1991 MRS Symposium Proceedings, 225, pp. 99–105.
Filippi, et al., The Effect of Copper Concentration on the Electromigration Lifetime of Layered Aluminum Copper Metallurgy With Tungsten Diffusion Barriers, 1992 VLSI multilevel interconnect Conf., pp. 359–365.
Tao, et al., Comparison of Electromigration Reliability of Tungsten and Aluminum Vias Under DC and the varying current stressing, 1992 IRPS Proceedings, pp. 338–343.

Primary Examiner—William Mintel
Assistant Examiner—Roy Potter
Attorney, Agent, or Firm—Jasper W. Dockrey

[57] ABSTRACT

A metal interconnect structure includes copper interface layers (24, 30) located between a refractory metal via plug (28), and first and second metal interconnect layers (16, 32). The copper interface layers (24, 30) are confined to the area of a via opening (22) in an insulating layer (20) overlying the first interconnect layer (16) and containing the via plug (28). The interface layers (24, 30) are subjected to an anneal to provide copper reservoirs (36, 37) in the interconnect layers (16, 32) adjacent to the interface layers (24, 30). The copper reservoirs (36, 37) continuously replenish copper depleted from the interface when an electric current is passed through the interconnect structure. A process includes the selective deposition of copper onto an exposed region (23) of the first metal interconnect layer (16), and onto the upper portion the via plug (28), followed by an anneal in forming gas to form the copper reservoirs (36, 37).

15 Claims, 3 Drawing Sheets

SEMICONDUCTOR DEVICE HAVING AN IMPROVED METAL INTERCONNECT STRUCTURE

FIELD OF THE INVENTION

This invention relates, in general, to semiconductor devices, and to methods of fabrication, and more particularly to metal interconnect structures including metals having differing physical properties, and to a method for fabricating multi-level metal interconnect structures.

BACKGROUND OF THE INVENTION

There is a continuing trend in the semiconductor industry to fabricate integrated circuits of increasing complexity. The fabrication of extremely complex, high-density integrated circuits has been made possible through advances in integrated circuit fabrication technology. Fabrication technology now exists having the capability to define circuit components having feature sizes in the sub-micron size range. For example, new lithographic techniques have been developed using X-ray and pulse-laser energy sources. Additionally, film deposition technology now exists with the capability to form thin-films having precisely determined metallurgical compositions and thicknesses. Furthermore, film deposition techniques have been developed which are capable of selectively depositing metals in precisely defined locations during device fabrication.

While advanced fabrication technology can create large numbers of sub-micron sized device components, reducing overall size of a semiconductor device, such as a memory device, is limited because each device component must be electrically contacted by metal leads carrying control signals to and from the device component. However, the number of die on each substrate must by maximized to keep production costs at an economically competitive level. Therefore, the system of metal interconnections to the device components must be configured in such a way as to not increase the overall die size.

To maintain a small die size, high-density integrated circuits are now commonly fabricated with multiple levels of metal interconnects. Typically, the metal interconnect layers are separated by interlevel dielectric layers and electrically coupled by metal-filled vias residing at selected locations in the interlevel dielectric layers. The vias are filled by a metal plug which provides an electrical conduit between overlying metal interconnect layers. Aluminum and aluminum alloys are widely used to form metal interconnects in integrated circuits.

Although aluminum and aluminum alloys can be used to form metallized via plugs, in certain cases aluminum can not be reliably deposited to form a high reliability via plug. Accordingly, tungsten has become an increasingly popular material for the formation of metallized via plugs. Tungsten possesses high electrical conductivity and can be readily deposited into high aspect ratio vias. Additionally, a variety of deposition processes are available for the formation of both blanket tungsten, and selectively deposited tungsten. However, the physical properties of tungsten differ substantially from the physical properties of aluminum and aluminum alloys. Tungsten is a mechanically hard, high-density metal having a high melting point. In contrast, aluminum is a soft, ductile metal having a relatively low melting point, and characterized by large grain structure. When electrons flow from hard metals, such as tungsten, to a softer metal, such as aluminum, a flux divergence occurs at the metallic interface. In the softer metal, the flow of electrons pushes metal atoms in the softer metal away from the interface. This phenomenon is known as electromigration and severely degrades the current handling capability of the metallization structure. Because tungsten has a high density and melting point, it does not experience a mechanical deformation when subjected to a high electrical current. Moreover, tungsten does not self-diffuse when subjected to high electrical current. Therefore, electromigration of the softer metal, in the direction of electron flow, causes a void at the tungsten-aluminum interface.

One method of reducing the flux divergence at the metal interface includes placing a thick, refractory metal barrier between the tungsten plug, and the metal interconnect. However, due to the high electrical resistivity of most refractory barrier materials, the barrier layer must be relatively thick to be effective. Such thick barrier layers add a great deal of complexity and difficulty in the fabrication of the metal interconnect structure. Accordingly, improvements in the structural arrangement of a refractory-metal filled via plug are necessary to overcome the inherent electromigration problems encountered in existing metal interconnect structures.

SUMMARY OF THE INVENTION

In practicing the present invention there is provided a semiconductor device having an improved metal interconnect structure, and a process for fabricating the interconnect structure. The interconnect structure includes a first metal body having grain boundaries therein. The structure further includes a second metal body and a copper layer intermediate to the first and second metal bodies. A copper reservoir resides in the first metal body, and is in intimate contact with the copper layer. In operation, an electrical current is passed through the first and second metal bodies. Copper from the copper reservoir migrates into the grain boundaries in the first metal body. The high copper concentration in the first metal body prevents mechanical deformation in the first metal body caused by a mass flux divergence at the metal interface as electrical current passes through the metal bodies.

A process for fabricating the metal interconnect structure includes providing a semiconductor substrate having a metal interconnect layer thereon. A copper layer is formed to overlie the metal interconnect layer, and a refractory metal layer is formed to overlie the copper layer. After forming the refractory metal layer, a diffusion process is performed to diffuse copper from the copper layer into the metal interconnect to form a copper diffused region in the metal interconnect layer.

It will be appreciated that for simplicity and clarity of illustration, elements shown in the FIGURES have not necessarily been drawn to scale. For example, the dimensions of some of the elements are exaggerated relative to each other for clarity. Further, where consid-

DETAILED DESCRIPTION OF PREFERRED EMBODIMENTS

The present invention provides an improved metal interconnect structure, which prevents the formation of voids at the interface of two metals having different physical properties. In one aspect of the invention, a copper reservoir is created in an interconnect metal having a granular morphology. The reservoir continuously replaces copper in the interconnect metal that is depleted from the grain boundaries as an electrical current passes from a metal having much greater density into the interconnect metal. Multi-level metallization structures in semiconductor devices often use combinations of hard, refractory metals and soft, ductile metals. When electrons flow from a hard metal to a much softer one, a mass flux divergence occurs at the metallic interface. In the softer metal, the "electron wind" pushes the softer metal away from the interface. However, the mass flux is not great enough to mechanically deform the harder metal. Thus, at the interface, a void is created by the mechanical deformation of the softer metal. This phenomenon severely degrades the current handling capability of the metal interconnect structure.

The present invention prevents the formation of voids at the metal interface by placing a layer of copper between the harder metal and the softer metal. Typically, the softer metal is an interconnect metal such as aluminum, or an aluminum alloy such as aluminum silicon, or aluminum copper silicon, and the like. The morphology of the interconnect metals is characterized by large granular regions with distinct boundaries between the metal grains. It is known that the aluminum alloyed with copper resists mechanical deformation caused by high electrical current. Accordingly, to further enhance the resistance to void formation in the interconnect metal, a copper reservoir is formed in the interconnect metal adjacent to the copper layer. As an electrical current is passed through the hard metal and diverges into the interconnect metal, copper from the copper reservoir continuously replenishes copper which is depleted from the grain boundaries by the electron flux. Thus, the present invention provides a source of copper at the point of flux divergence to continuously replace copper depleted from the interface. The advantages of the present invention can be more fully understood following a description of a preferred process for the fabrication of the metal interconnect structure;.

Figure 1:
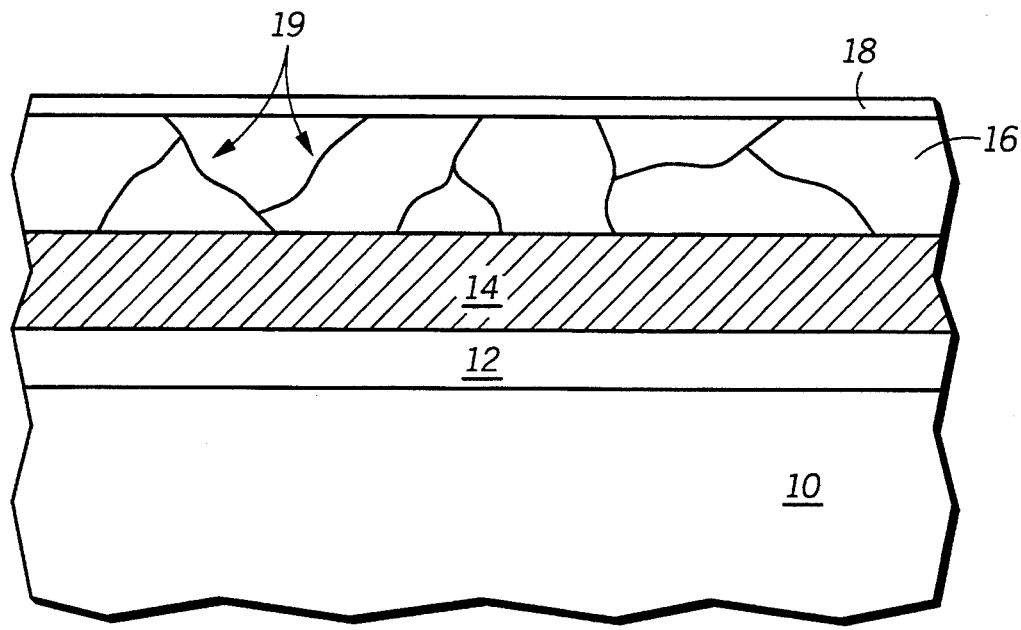
FIGS. 1-6 illustrate, in cross-section, process steps for providing a metal interconnect structure and for fabricating the interconnect structure in accordance with the invention.
Figure 2:
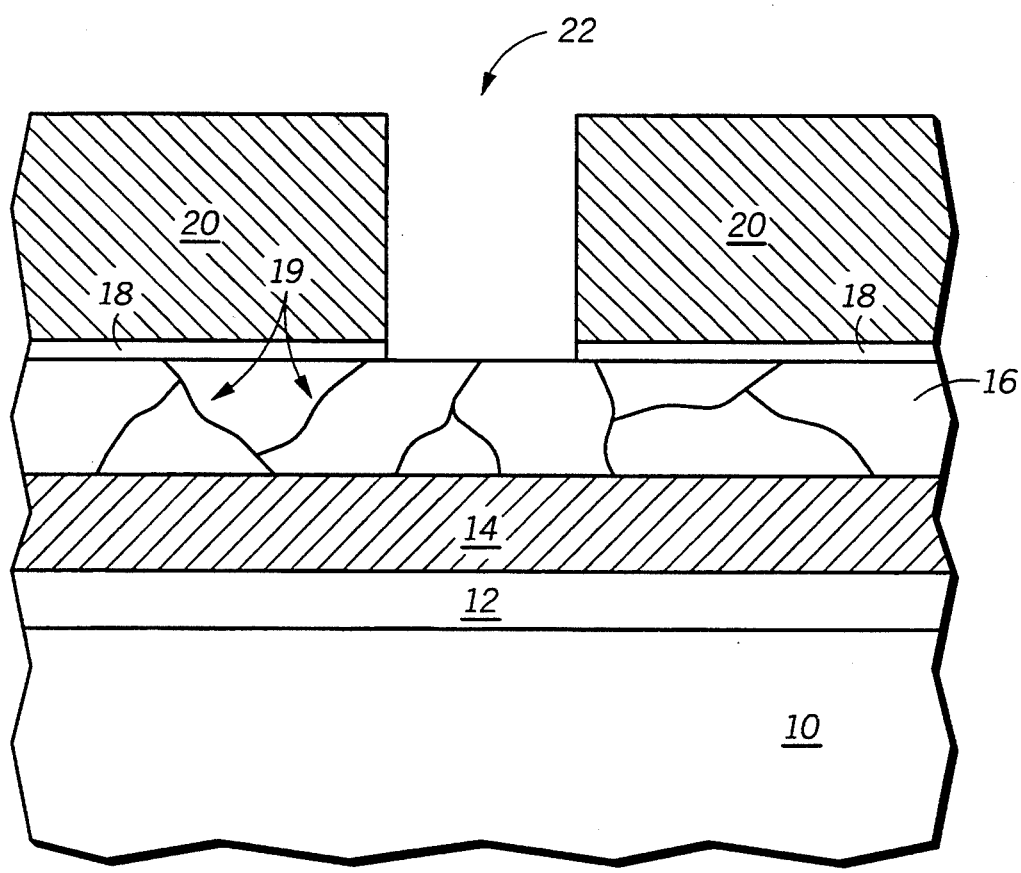

Shown in FIG. 1, in cross.-section, is a portion of a semiconductor substrate 10 having already undergone several process steps in accordance with the invention. The structure illustrated in FIG. 1 includes a device layer 12 overlying substrate 10, and an insulating layer 14 overlying device layer 12. Device layer 12 contains various device components commonly present in a semiconductor device, such as transistors, resistors, capacitors, and the like. The device components are fabricated in active device regions in substrate 10, which are electrically isolated by field isolation regions. Typically, the device components are comprised of patterned layers of semiconductor materials. Although not illustrated in detail, those skilled in the art will appreciate that the various device components of device layer 12 contain contact regions enabling the various device components to be electrically contacted by an overlying metal interconnect layer.

As illustrated in FIG. 1, a first metal interconnect layer 16 is separated from device layer 12 by insulating layer 14. Insulating layer 14 can be any one of a number of common electrically insulating materials, such as chemical vapor deposited silicon dioxide, a silicate glass doped with either boron or phosphorous, or both, or a spin-on glass material, and the like. Preferably, first interconnect layer 16 is aluminum alloyed with copper. In a typical semiconductor device, a first metal interconnect layer will make contact to active components in device layer 12 through a series of contact openings (not shown) in insulating layer 14. The structure illustrated in FIG. 1 is shown at a point in the process prior to the, photolithographic patterning of first interconnect layer 16. Accordingly, first interconnect layer 16 is covered by an anti-reflective coating 18. Anti-reflective coating 18 reduces the optical reflection from interconnect layer 16 enabling high definition photolithographic patterning of first interconnect layer 16. Those skilled in the art will recognize that the use of an anti-reflective coating is an optional processing feature, which can be eliminated depending upon the particular photolithographic patterning process.

To improve the etch characteristics of first interconnect layer 16, the copper concentration is preferably less than about one weight percent. As will subsequently be described, the improved etch characteristics of first metal interconnect layer 16 represents an advantage of the present invention. First metal interconnect layer 16 contains a plurality of grain boundaries 19. The morphology of first metal interconnect layer 16 is characterized by a plurality of metal grains. The average grain size of the metal film depends upon the particular process used to deposit the metal, and the processing parameters employed. For example, in a metal sputtering process, the grain size may be increased by increasing the substrate temperature during metal deposition. Metal interconnect layer 16 is preferably formed by sputter deposition using a sputtering target containing aluminum and copper.

Following the formation of first metal interconnect layer 16, the process continues by depositing an interlevel dielectric layer 20 onto anti-reflective coating 18. Interlevel dielectric layer 20 is photolithographically patterned, and both interlevel dielectric layer 20 and anti-reflective coating layer 18 are etched to form a via opening 22. Via opening 22 exposes a portion 23 of the surface of first metal interconnect layer 16. Interlevel dielectric layer 20 can be any of a number of different electrically insulating materials, such as a silicate glass doped with either boron or phosphorous, or both, spin-on glass, silicon dioxide chemical vapor deposited using tetraethylorthosilane (TEOS) source gas, and the like. Preferably, interlevel dielectric layer 20 is anisotropically etched using fluorinated etching gases. In one embodiment, interlevel dielectric layer 20 is silicon dioxide, deposited by plasma enhanced chemical vapor deposition (PECVD) using tetraethylorthosilane (TEOS) source gas. Interlevel dielectric layer 20 is deposited to a thickness ranging from several hundred nanometers to more than 1 micron, and via opening 22 has a diameter of about 1 micrometer or less.

Figure 3:
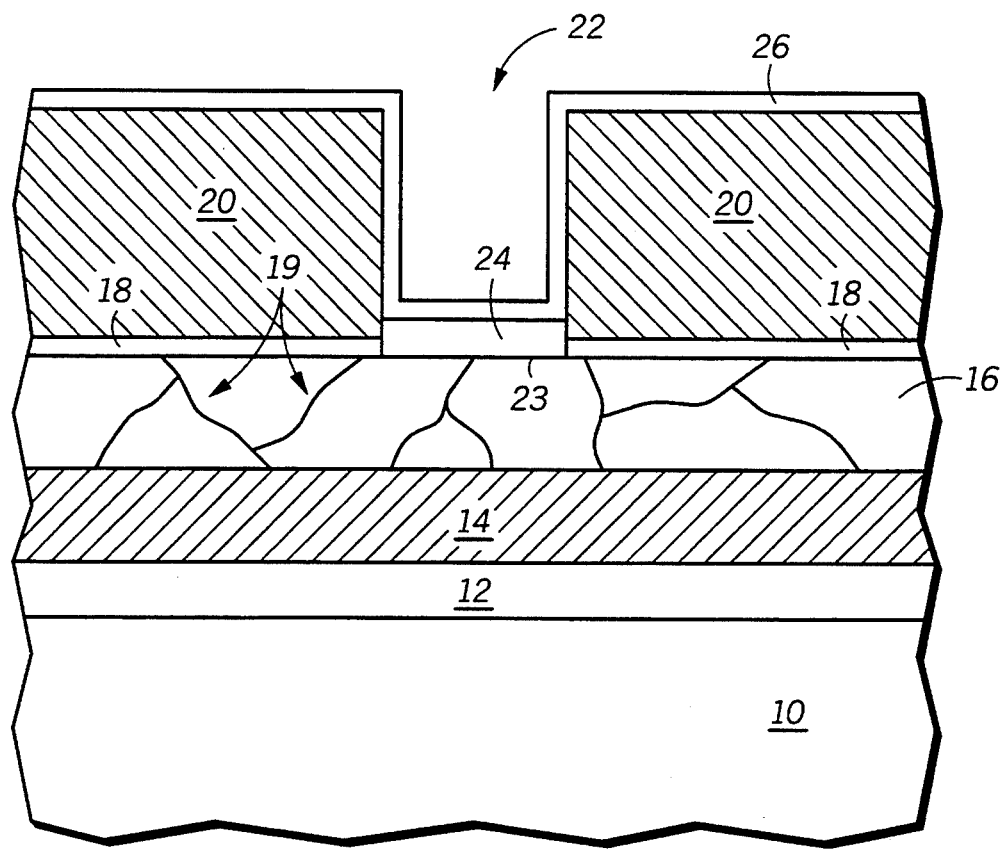

As illustrated in FIG. 3, in accordance with a preferred embodiment of the invention, a first copper interface layer 24 is formed on exposed metal surface 23. Interface layer 24 is preferably formed by a selective deposition process in which copper is preferentially chemical vapor deposited onto exposed metal surface 23. In the selective copper deposition process, the deposition reaction is adjusted so that copper is deposited only on exposed interconnect metal. Exposed metal surfaces, such as surface 23, act as a nucleation site for the selective deposition process. Once the selective deposition begins on a nucleation site, the selectively deposited copper itself acts as a nucleation site so that the reaction continues depositing successive layers of copper, eventually forming a uniformly thick layer. The selectively deposited copper does not otherwise deposit on oxides or other dielectric materials. To ensure effective nucleation for the selective copper deposition, surface 23 is cleaned using an RF sputtering process prior to beginning the selective deposition process.

Preferably, copper is deposited by metal-organic-chemical-vapor-deposition (MOCVD) to a thickness of about 20 to 200 nanometers. The MOCVD process is carried out using metal-organic precursors of copper (I) and copper (II). The metal-organic copper precursors are complex molecules in which organic ligands are bonded to copper by an oxygen atom in the ligand. One family of metal-organic copper precursors for MOCVD copper deposition includes copper (II) $\beta$-diketonate compounds. The copper $\beta$-diketonate compounds are highly volatile and yield high purity copper at relatively low deposition temperatures. In an MOCVD apparatus, several types of delivery systems can be used for transporting the copper precursor to the chemical vapor deposition reaction chamber depending upon whether the copper precursor is a solid or a liquid at room temperature. Solid precursors require a sublimation system to transport a sublimed vapor of the solid precursor to the deposition system. In the case where the precursor is a liquid, a bubbler system is used to transport an entrained vapor to the deposition chamber. Hydrogen gas can be used in the delivery system, so long as the temperature of the delivery system is not excessive. Both copper (I), and copper (II) $\beta$-diketonate precursors readily undergo decomposition in the presence of hydrogen at temperatures ranging from 150°–400° C.

In a preferred embodiment, the copper deposition is carried out using the Cu(I) precursor, copper hexafluoroacetylacetonate vinyltrimethylsilane (Cu(hfac)VTMS). To effect the deposition, the Cu(hfac)VTMS is maintained in a liquid container at 40° C. and hydrogen is bubbled through the liquid. Preferably, the hydrogen carrier gas flow rate is maintained at about 100–200 sccm, and most preferably at about 140 sccm. In addition, a small amount of water vapor is introduced to the precursor flow downstream from the liquid bubbler. The water vapor functions to increase the copper deposition rate at the susceptor. In the embodiment described herein, the addition of water vapor is an optional processing step which may be omitted when practicing the present invention. Preferably, the water vapor is maintained at a partial pressure of about 5–15 millitorr, and most preferably at about 11 millitorr. The copper is preferably deposited in a cold wall deposition system having a susceptor, which is maintained at a temperature of about 190° C.

Once first interface layer 24 is formed, a metal adhesion layer 26 is deposited to overlie first interface layer 24 and interlevel dielectric layer 20. Adhesion layer 26 provides an adhesive surface upon which a hard metal, such as a refractory metal, can be deposited. Preferably, adhesion layer 26 is a composite layer which includes a layer of titanium nitride overlying a layer of titanium. In addition to providing an adhesive surface, adhesion layer 26 also functions as a diffusion barrier. The titanium nitride component of adhesion layer 26 will prevent components of reaction gasses used during a subsequent chemical vapor deposition steps from diffusing into first interface layer 24. Alternatively, adhesion layer 26 can be another metal or metal alloy which has a low electrical resistance, such as a titanium-tungsten alloy, and the like.

Figure 4:
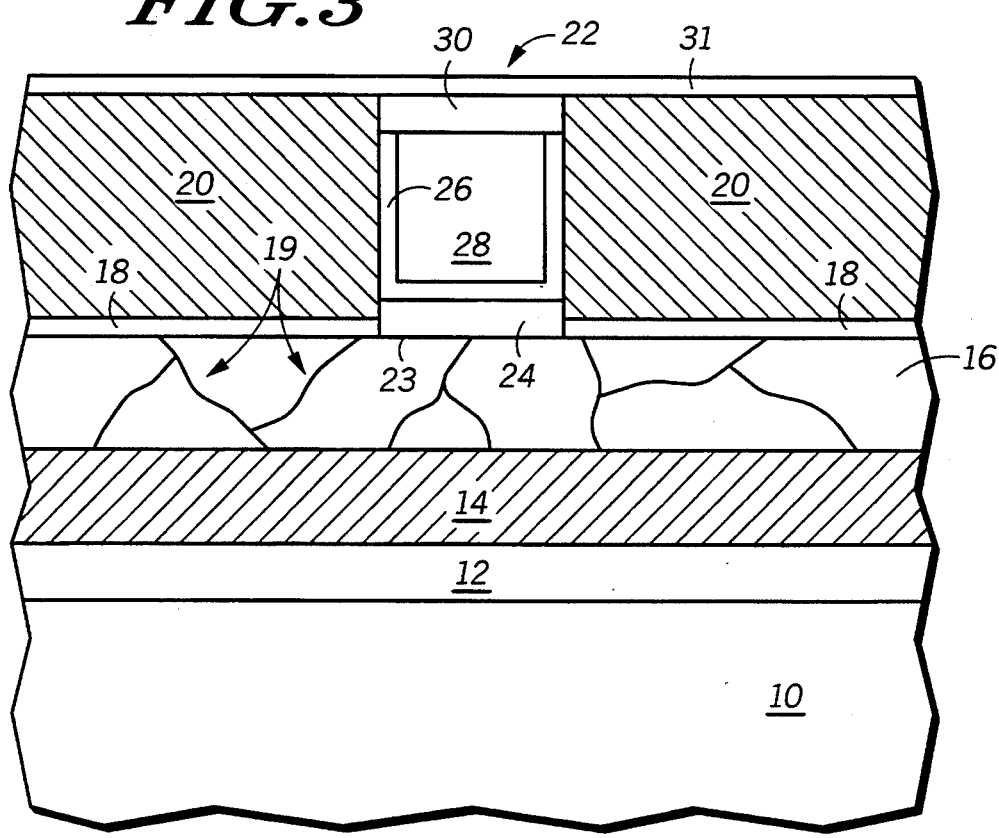

After depositing adhesion layer 26, a refractory metal is blanket deposited to overlie adhesion layer 26, and both the refractory metal and the adhesive metal composite are etched to form a metal via plug 28, as illustrated in FIG. 4. In a preferred embodiment, via plug 28 is tungsten. Tungsten is deposited by chemical vapor deposition using tungsten hexafluoride (WF$_6$) source gas. During deposition, the titanium nitride in adhesion layer 26 prevents the diffusion of fluorine into first interface layer 24. Adhesion layer 26 also prevents tungsten nucleation on regions of first metal interconnect layer 16 adjacent to via opening 22.

After depositing a blanket tungsten layer, both the refractory metal and the adhesion metal are etched in a single etching tool using a sequential etching process. In the first etching process, a fluorinated etch gas is used to etch away portions of the refractory metal overlying the upper surface of interlevel dielectric layer 20. The etching process is then continued to remove a portion of the refractory metal at the upper surface of via opening 22. Once the refractory metal is etched, the remaining exposed portions of adhesion layer 26 are etched away using chlorinated etching gases. Alternatively, substrate 10 can be removed from the etching tool, and the remaining exposed portions of adhesion layer 26 removed in a wet chemical etchant, or another plasma etching process.

In an alternative embodiment, after depositing the blanket tungsten layer, both the refractory metal and the adhesion metal can be etched back using chemical-mechanical-polishing. In such a case, the use of the flourinated etch gas used to etch away portions of the refractory metal overlying the upper surface of interlevel dielectric layer 20 followed by the use of chlorinated etch gas to remove the remaining exposed portions of adhesion layer 26 of the above embodiment may not be required.

The refractory metal etching process creates a recessed region at the upper surface of via opening 22 in which a second copper interface layer 30 is formed. Following a cleaning process to remove any native oxide or etching residues from the surface of via plug 28, in a preferred embodiment, a previously described selective deposition process is carried out to form second interface layer 30. Preferably, copper is selectively deposited to a thickness sufficient to fill the recess and form a smooth planar surface continuous with interlevel dielectric layer 20. In order to provide substantially the same quantity of copper at the upper surface of via plug 28, about 20 to 200 nanometers of copper is deposited. Alternatively, a copper layer can be blanket deposited and planarized using a chemical-mechanical-polishing process.

Following the deposition of second interface layer 30, a copper permeable layer 31, such as titanium, can be optionally deposited onto second interface layer 30 and interlevel dielectric layer 20. An additional titanium layer can improve the electromigration resistance of a metal interconnect by suppressing mass flux divergence internal to the metal interconnect itself. Because second interface layer 30 intervenes to prevent mass flux divergence at the plug, layer 31 can be very thin, preferably, 10 to 20 nanometers. This is in contrast to the prior art where, typically, a refractory metal layer must be deposited to a great thickness (100 nanometers or more) to overcome low electrical resistivity characteristic of refractory metal barriers. Thus, the present invention enables the use of a thin refractory metal layer, such as layer 31, to enhance electromigration resistance of an overlying interconnect layer, while avoiding the process complexity inherent in the deposition and processing of thick refractory layers.

Figure 5:
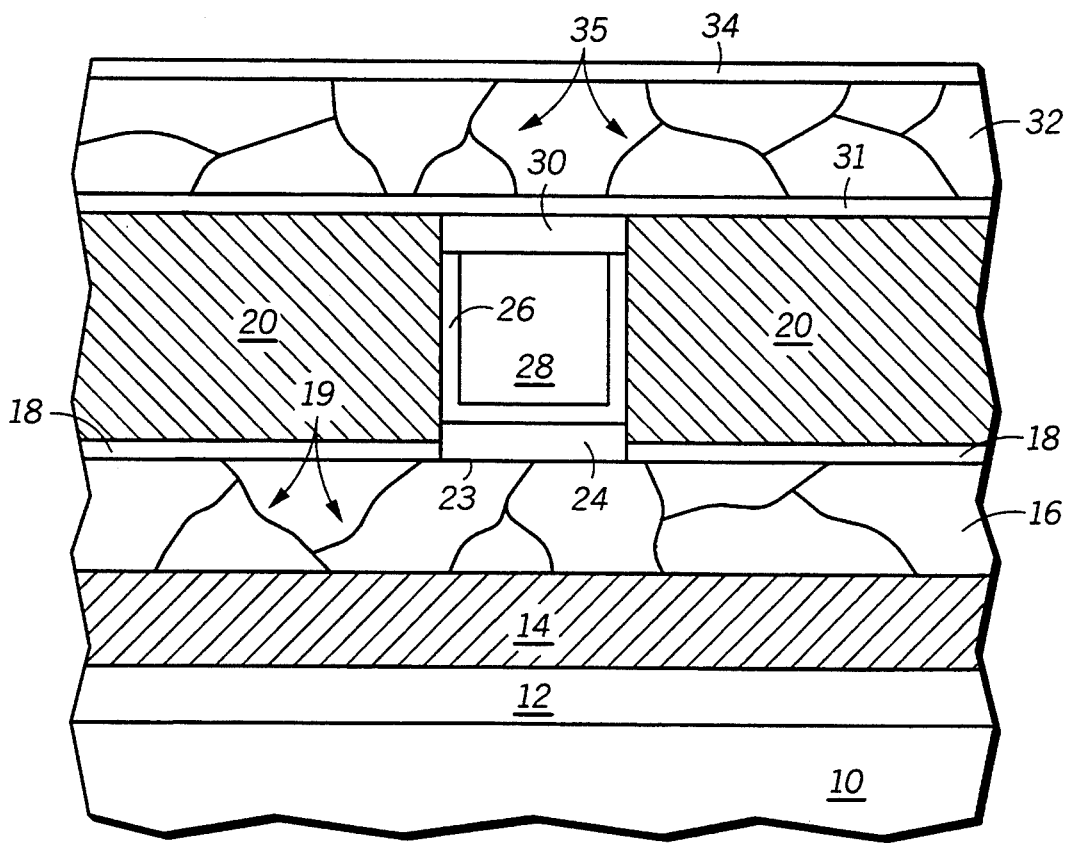

As illustrated in FIG. 5, a second metal interconnect layer 32 is formed to overlie interlevel dielectric layer 20 and second interface layer 30. Second metal interconnect layer 32 is preferably a metal alloy similar to first metal interconnect layer 16. Second metal interconnect layer 32 also contains grain boundaries 35 characteristic of the granular morphology of second metal interconnect layer 32. An optional anti-reflective coating 34 overlies second metal interconnect layer 32.

Upon the formation of second metal interconnect layer 32, a multi-level metallization structure is complete. The structure includes overlying metal interconnect layers 16 and 32, which are electrically coupled by a via plug 28. Copper interface layers 24 and 30 reside between the via plug and the interconnect metal and are confined within opening 22 created in interlevel dielectric layer 20. Interface layer 24 and 30 effectively separate the hard refractory metal body of via plug 28 from the soft, ductile metal of interconnect layers 16 and 32.

The foregoing has provided a description of a preferred embodiment for practicing the present invention. A number of other materials can be used which differ from this preferred embodiment, and yet still fall within the invention. For example, although the preferred metal for the formation of via plug 28 is tungsten, other refractory metals and refractory metal alloys can be used. The plug material must be highly conductive, conformal, and easily and rapidly deposited. Other suitable materials include, for example, molybdenum, cobalt, copper, titanium nitride deposited by chemical vapor deposition, and the like. Furthermore, adhesion layer 26 can include other metals such as tantalum, titanium-molybdenum, titanium nitride deposited by chemical vapor deposition, and the like. Moreover, first and second metal interconnect layer 16 and 32 can be formed by one of a number of different aluminum alloys, such as aluminum titanium, aluminum scandium, aluminum palladium, and the like.

Figure 6:
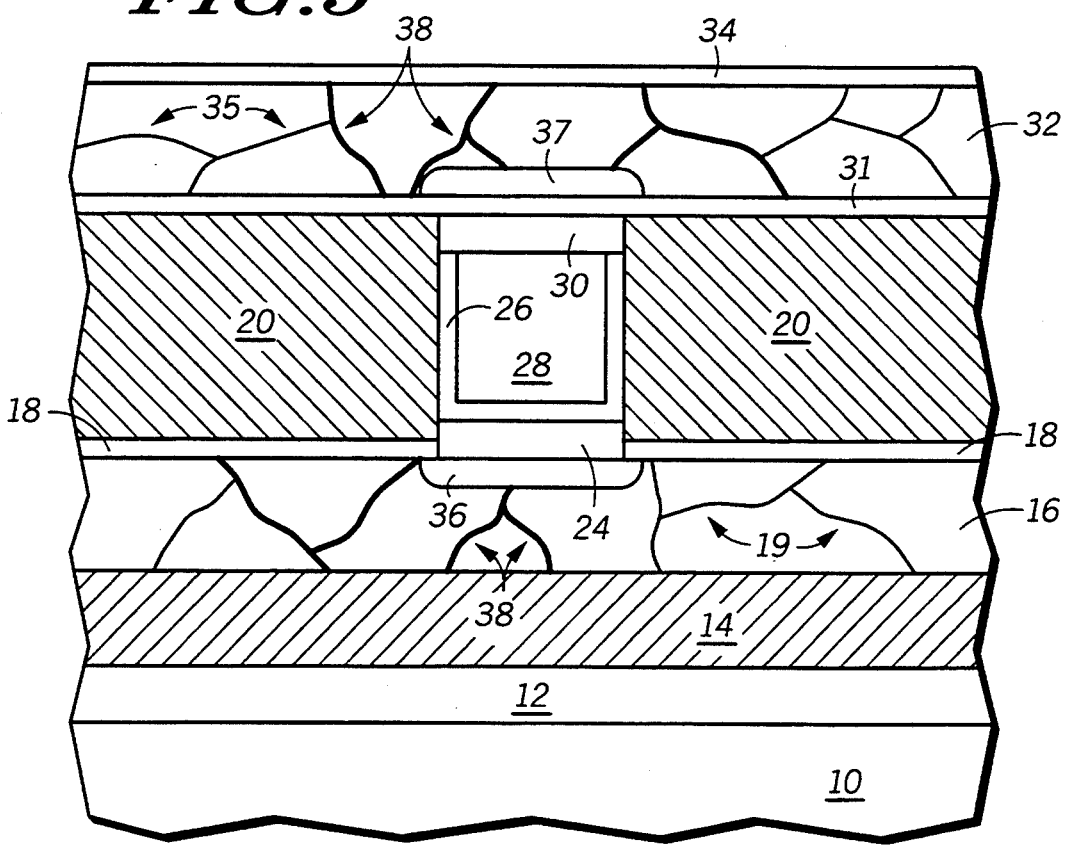

Following the fabrication of the multi-level metal structure, an annealing process is carried out to form copper reservoirs 36 and 37 in the metal interconnect layers, as illustrated in FIG. 6. Preferably, the annealing process is carried out in forming gas at a temperature of about 300°–500° C. The annealing process causes copper to diffuse from interface layers 24 and 30 into adjacent regions of metal interconnect layers 16 and 32, respectively. The copper-rich reservoirs provide a source of copper to replenish the copper that is depleted from the grain boundaries of the interconnect layers when electrical current is passed through the multi-level metal structure. Preferably, the copper reservoirs have a copper concentration in the range of 1.5 to 5 weight percent. Accordingly, the copper concentration in copper reservoirs 36 and 37 is substantially greater than that of interconnect layers 16 and 32, and is limited only by the capacity of the grain boundaries to adsorb copper under a given set of thermal annealing conditions. In the case where an optional refractory layer 31 is present, the copper first diffuses through layer 31, then into second metal interconnect layer 32. Because layer 32 is permeable to copper, the formation of copper reservoir 36 is not impeded by the presence of layer 32.

During the electrical operation of the inventive interconnect structure, copper precipitates in the grain boundaries and is swept away from the vicinity of the metal interface. The continual precipitation of copper in the grain boundaries forms copper-rich grain boundaries 38 adjacent to reservoirs 36 and 37. As illustrated in FIG. 6, only a portion of the grain boundaries in interconnect layers 16 and 32 contain large quantifies of copper precipitants. Grain boundaries 19 and 35, located in regions of interconnect layers 16 and 32 that are spaced away from reservoirs 36 and 37, do not contain large concentrations of copper precipitants.

Through the foregoing description it is apparent that the process of the invention forms highly concentrated regions of copper at the specific locations in a multi-level metal structure where electron flux divergence is great. By forming regions of high copper concentration in regions of high flux divergence, the electromigration of metal in the interconnects is prevented. Because electromigration in the interconnect metal is minimized, the current handling capability of the entire interconnect structure is increased. The greater current handling capability of the metal interconnect structure of the present invention improves the overall device performance. By providing high current levels at selected locations in a semiconductor device, electrical charge can be rapidly built up and dissipated, improving device performance parameters, such as capacitor charging, and transistor switching speeds, and the like.

Additionally, the present invention avoids the necessity of depositing interconnect metal having high concentrations of copper, which is difficult to etch. High density aluminum interconnects are typically etched in plasma etching systems using etching gases such as chlorine and boron trichloride. These gases readily react with copper causing extensive metal corrosion. Using the present invention, interconnect metal can be deposited having copper concentrations of one weight percent or less.

Thus it is apparent that there has been provided, in accordance with the invention, a semiconductor device having an improved metal interconnect structure and process which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, refractory metals and copper can be deposited by various methods, such as molecular beam epitaxy, and the like. Further, the via plug metal can be pure copper. It is therefore intended to include within the invention all such variations and modifications as fall within the scope of the appended claims and equivalents thereof.

We claim:

1. A semiconductor device comprising:
   a metal interconnect;

an insulating layer overlying the interconnect and having an opening therein exposing a portion of the interconnect;

a second metal layer filling the opening;

a copper layer intermediate to the metal interconnect and the second metal layer; and a copper reservoir underlying the metal interconnect and in intimate contact with the copper layer, wherein copper from the copper reservoir continuously replenishes copper depleted by electromigration from the metal interconnect.

2. The device of claim 1 further comprising:

a plurality of grain boundaries within the metal interconnect, wherein a first portion of the grain boundaries reside in close proximity to the copper-diffused region and a second portion are spaced away from the copper reservoir, and wherein the first portion contains a concentration of copper in excess of the second portion.

3. The device of claim 1, wherein the metal interconnect comprises a metal selected from the group consisting of aluminum, aluminum copper, aluminum copper silicon, aluminum titanium, aluminum scandium, aluminum palladium, and the second metal layer comprises a refractory metal.

4. The device of claim 1, wherein the metal interconnect comprises a metal alloy including copper, and wherein the copper concentration in the copper reservoir is substantially greater than the concentration of copper in the metal interconnect.

5. A semiconductor device comprising:

a first metal interconnect;

an insulating layer overlying the first metal interconnect and having an opening therein exposing a portion of the first metal interconnect;

a via metal layer filling the opening;

a first copper layer intermediate to the first metal interconnect and the via metal layer;

a first copper reservoir underlying the first metal interconnect and in intimate contact with the copper layer;

a second metal interconnect overlying the insulating layer and spaced apart from the via metal layer by a second copper layer; and a second copper reservoir overlying the second copper layer and in intimate contact therewith, wherein copper from the first and second copper reservoirs continuously replenishes copper depleted by electromigration from the first and second metal interconnects, respectively.

6. The device of claim 5, wherein the first and second metal interconnects comprise a metal alloy including copper, and wherein the copper concentration in the first and second copper reservoirs is substantially greater than the copper concentration in the first and second metal interconnects.

7. The device of claim 5, wherein the first and second metal interconnects comprise an aluminum-copper alloy, wherein the alloy has less than 1 weight percent copper, and the via metal comprises tungsten.

8. A semiconductor device comprising:

a first metal body having grain boundaries therein;

a second metal body;

a copper layer intermediate to the first and second metal bodies; and a copper reservoir in the first metal body, wherein the copper reservoir is in intimate contact with the copper layer, wherein copper from the copper reservoir continuously replenishes copper depleted by electromigration from the first and second metal bodies, and wherein diffused copper from the copper reservoir resides in a portion of the grain boundaries.

9. The device of claim 8, wherein the first metal body comprises a metal selected from the group consisting of aluminum, aluminum silicon, aluminum-copper-silicon, and the second metal body comprises a refractory metal.

10. The device of claim 8, wherein the first metal body comprises a metal alloy including less than 1 weight percent copper, and wherein the copper concentration in the copper reservoir is substantially greater than the copper concentration in the first metal body.

11. A semiconductor device comprising:

a first metal layer;

an insulating layer overlying the first metal layer and having an opening therein;

a via metal layer filling the opening;

a copper layer overlying the via metal layer;

a metal interconnect overlying the insulating layer and contacting the copper layer; and a copper reservoir in the metal interconnect overlying the copper layer and in intimate contact therewith, wherein copper from the copper reservoir continuously replenishes copper depleted by electromigration from the metal interconnect.

12. The device of claim 11, wherein the copper layer resides within the opening.

13. The device of claim 11, wherein the metal interconnect comprises a metal selected from the group consisting of aluminum, aluminum copper, aluminum-copper-silicon, and the via metal layer comprises a refractory metal.

14. The device of claim 11, wherein the metal interconnect comprises a metal alloy including less than 1 weight percent copper, and wherein the copper concentration in the copper reservoir is substantially greater than the copper concentration in the metal interconnect.

15. The device of claim 11 further comprising a copper permeable layer overlying the copper layer and the insulating layer and intermediate to the copper layer and the copper reservoir.

* * * * *